United States Patent
Oyamatsu

(10) Patent No.: US 6,833,301 B2
(45) Date of Patent: Dec. 21, 2004

(54) SEMICONDUCTOR DEVICE WITH AN IMPROVED GATE ELECTRODE PATTERN AND A METHOD OF MANUFACTURING THE SAME

(75) Inventor: Hisato Oyamatsu, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 10/612,988

(22) Filed: Jul. 7, 2003

(65) Prior Publication Data

US 2004/0029327 A1 Feb. 12, 2004

Related U.S. Application Data

(62) Division of application No. 09/418,035, filed on Oct. 14, 1999, now Pat. No. 6,653,695.

(30) Foreign Application Priority Data

Oct. 15, 1998 (JP) ............................................. 10-293901

(51) Int. Cl.[7] .................. H01L 21/8234; H01L 21/8244
(52) U.S. Cl. ....................... 438/238; 438/279; 438/283; 438/381
(58) Field of Search ................................ 438/237, 279, 438/283, 381

(56) References Cited

U.S. PATENT DOCUMENTS

| 5,652,441 A | 7/1997 | Hashimoto et al. ......... 257/206 |
| 5,731,618 A | 3/1998 | Ishigaki | |
| 6,285,088 B1 | 9/2001 | Madan ....................... 257/206 |

*Primary Examiner*—Long Pham
(74) *Attorney, Agent, or Firm*—Banner & Witcoff, Ltd.

(57) ABSTRACT

Disclosed is a semiconductor device and a process for producing a semiconductor device using a gate electrode such as an SRAM, wherein a gate electrode pattern is formed with fidelity to a reticle pattern through no complicated layout design and the gate electrode pattern is formed in an area smaller than that of a conventional semiconductor device. In a lithographic step using a reticle pattern provided with substantially linear gate electrode patterns, a projecting portion in which at least a part of a contact region is arranged is formed such that it is included in almost the center of a long side of a linear gate electrode pattern and a concave portion facing at least the entire length of the projecting portion is formed such that it is included in a long side opposite to the projecting portion between transistor regions of a reticle pattern. In miniaturization technologies, the fidelity of a pattern in a process for the production of a semiconductor device can be improved by the reticle pattern having the concave portion.

9 Claims, 11 Drawing Sheets

SEMICONDUCTOR DEVICE WITH AN IMPROVED GATE ELECTRODE PATTERN AND A METHOD OF MANUFACTURING THE SAME

BACKGROUND OF THE INVENTION

This application is a Divisional of U.S. application Ser. No. 09/418,035 filed on Oct. 14, 1999, now U.S. Pat. No. 6,653,695, hereby incorporated by reference as to its entirety. This application is based upon and claims the benefit of priority from the prior Japanese Patent Application 10-293901, filed Oct. 15, 1998, the entire contents of which are incorporated herein by reference. The present invention relates to a gate structure of a semiconductor device and, particularly, to a cell layout of an SRAM (Static Random Access Memory) having a MOS transistor and to a reticle pattern for producing a semiconductor device.

Products of semiconductor devices such as ICs and LSIs are produced basically through a design step (functional design, logical design, layout design and the like) and a production test step (chip production step, test evaluation step and the like). Process technologies for semiconductor devices have come to be established in a new generation deep submicron technologies. With this progress, the width of wirings used in semiconductor devices has come to be reduced to 0.3 $\mu$m or less. However, such a tendency of a reduction in, for instance, the width of wirings of, e.g., polysilicon wirings, makes it impossible to neglect a microscopic variation in the width of wirings which is caused by a optical proximity effect. The optical proximity effect is a phenomenon that the finishing value of the wiring width of the polysilicon wiring is changed by a space between this wiring and an adjacent polysilicon wiring. In other words, this is a phenomenon that dimensional accuracy is impaired by a optical proximity effect when, along with miniaturization and densifying of a pattern in a semiconductor device, a charge beam exposure apparatus or an optical reduction-projection exposure apparatus is used in the printing and exposing such a pattern.

Highly integrated and high performance semiconductor devices have been developed by virtue of a development and progress in fine processing techniques. In lithographic techniques which play an important role among the fine processing techniques, techniques such as the use of light with shorter wavelengths, a development of photoresist materials having higher resolution and a formation of a more thinned film of photoresist materials on the premise that a highly uniform film is applied owing to an improvement in a control of the thickness of photoresist films greatly contribute to an improvement in the fine techniques. However, the above high resolution techniques cannot allow the same processing accuracy and margin in a lithographic step as in the case of using a line-space pattern as a simple fine pattern.

This problem of fidelity of a pattern greatly affects miniaturization of, for instance, SRAMs forming six MOSFETs in one memory cell.

FIG. 7 is a top plan view showing a cell layout of an SRAM suitable for miniaturization. This SRAM is characterized in that, by connecting a drain of a load transistor (pMOS transistor) of an SRAM cell to a drain of a drive transistor (nMOSFET) by using a local interconnect 23 of tungsten (W) (see FIG. 15 and FIG. 16), a metal wiring is used only for connection between a gate electrode and local interconnects to produce a simple and highly symmetric pattern in contrast with the case of a memory cell using no local interconnect, thereby achieving a reduction in cell area. FIG. 9 is a sectional view of the SRAM cell suitable for miniaturization which is shown in FIG. 7. FIG. 21 is a top plan view showing a wiring section in a cell layout of the SRAM shown in FIG. 7. FIG. 22 is a top plan view showing a wiring section in a cell layout of the SRAM shown in FIG. 8. It is clear from these figures that the SRAMs using local interconnects serve to reduce a cell area.

FIGS. 10A and 10B, FIGS. 11A and 11B, FIGS. 12A and 12B, FIGS. 13A and 13B, FIGS. 14A and 14B, FIG. 15, and FIG. 16 are sectional views showing a process flow in the production of the SRAM shown in FIG. 7. An $SiO_2$ film 32 with a thickness of, for example, 10 nm is formed on a p-type silicon semiconductor substrate 1 by thermal oxidation. A polycrystal silicon film 33 with a thickness of about 200 nm is formed on the $SiO_2$ film 32 by an LP-CVD method. A silicon oxide film ($SiO_2$) 34 with a thickness of about 200 nm is formed on the polycrystal silicon film 33 by an LP-CVD method. Then, an element region is coated with a photoresist pattern 35 by a photographic etching method (FIG. 10A).

The silicon oxide film 34 is etched by anisotropic dry etching having a high selective ratio to a polycrystal silicon film by using the photoresist pattern as a mask to exfoliate the photoresist pattern 35. Using the resulting silicon oxide film 34 thus formed as a mask, the polycrystal silicon 33 is then etched by anisotropic dry etching capable of taking a wide selective ratio to an oxide film. Moreover, the thermal oxide film 32 is etched and thereafter the silicon semiconductor substrate 31 is etched to a depth of 0.5 $\mu$m by anisotropic dry etching capable of taking a wide selective ratio to an oxide film to form a groove section 45 of an STI (Shallow Trench Isolation) (FIG. 10B).

After that, an 1.5-$\mu$m-thick silicon oxide film ($SiO_2$) 37 is deposited by an LP-CVD method (FIG. 11A). Then, the silicon oxide film 37 is planarized by chemical mechanical polishing capable of taking a high selective ratio to polycrystal silicon. After being planarized, the silicon oxide film 37 is etched either using $NH_4F$ or by dry etching until the polycrystal silicon film 33 is just exposed (FIG. 11B). Thereafter the polycrystal silicon film 33 is etched by isotropic dry etching capable of taking a wide selective ratio to a silicon oxide film to form a buried oxide film 36. Heat treatment for reducing the film stress of the silicon oxide film 36 is then carried out at, for example, 1000° C. In succession, the silicon oxide film formed on the silicon semiconductor substrate 12 is etched using $NH_4F$, followed by, for example, thermal oxidation performed at 800° C. to form a silicon oxide film ($SiO_2$) 38. After that, a photoresist pattern is formed by photographic etching and P-type and N-type impurities are introduced into the semiconductor substrate 12 by ion-implantation. Thereafter, impurity atoms are activated by heat treatment at 1000° C. to form a P-well 39 and an N-well 40 and to adjust the threshold value of a MOS transistor formed there (FIG. 12A).

Next, the thermal oxide film 38 formed on the silicon semiconductor substrate 12 is removed and a gate insulation film ($SiO_2$) 41 with a thickness of about 6 nm is formed by a thermal oxidation method at 750° C. Thereafter, a polycrystal silicon film with a thickness of 300 nm is deposited by an LP-CVD method. A photoresist pattern for a gate electrode is further formed by a photographic etching method and a patterning of the polycrystal silicon film is carried out by anisotropic dry etching capable of taking a sufficient selective ratio to silicon oxide to form a gate electrode 42 (FIG. 12B). Then, a silicon oxide film ($SiO_2$) with a thickness of, for example, 5 nm is formed on the silicon semiconductor substrate 12 by a thermal oxidation method at 800° C. In succession, using a photoresist pattern formed by photographic etching, for instance As is introduced into the n-MOS transistor region at an acceleration voltage of 35 keV and a dose of $2E14\ cm^{-2}$ and, for instance, $BF_2$ is introduced into the p-MOS transistor region at an acceleration voltage of 15 keV and a dose of $2E14\ cm^{-2}$. Heat treatment is then performed at 1000° C. for 30 seconds in a $N_2$ atmosphere to form an $n^+$ impurity diffused region 44 and a $p^+$ impurity diffused region 45 (Shallow Extension region). A silicon nitride film (SiN) with thickness of about 150 nm is deposited by an LP-CVD method and the substrate is etched by anisotropic etching capable of taking a high selective etching ratio to a silicon oxide film to form a side wall 43 of silicon nitride (FIG. 13A).

Thereafter, using a photoresist pattern formed by photographic etching, for instance, $BF_2$ is introduced into the n-MOS transistor region at an acceleration voltage of 40 keV and a dose of $5E15\ cm^{-2}$. Heat treatment is then performed at 1000° C. for 30 seconds in a $N_2$ atmosphere to form a source region 46 and a drain region 47 (Deep Extension region) and the gate electrode is doped to form an $n^+$ region and a $p^+$ regions (FIG. 13B). After that, a silicon nitride film (SiN film) 48/a boron-phosphorus doped silica glass film (BPSG film) 19 are deposited in thicknesses of 50 nm/900 nm by an LP-CVD method and are then planarized by a CMP (Chemical Mechanical Polishing) method. Then, a photoresist pattern for opening a contact portion and a local interconnect portion are formed by photographic etching and etching is performed by anisotropic etching capable of taking a high selective etching ratio to silicon nitride to form a contact opening 22 and a local interconnect opening 21 (FIG. 14A). In succession, SiN formed on the bottom of the contact opening portion and local interconnect opening is selectively removed by anisotropic etching and thereafter, for example, Ti with a thickness of 10 nm is deposited on each bottom of the contact opening 22 and local interconnect opening 21 by sputtering.

Heat treatment is then performed, for instance, at 600° C. for 30 minutes in a $N_2$ atmosphere to form TiN on the surface of Ti. After 400-nm-thick tungsten (W) is deposited by a CVD method, tungsten on the BPSG film 19 is removed by a CMP method and the contact opening 22 and the local interconnect opening 21 are filled up with tungsten to form a contact 24 and a local interconnect opening 23 (FIG. 14B). After that, insulation films 25, 26 made of $SiN/SiO_2$ are deposited as interlayer insulation films in thicknesses of 50 nm/400 nm respectively by a p-CVD method. Next, a photoresist pattern of an 1Via is formed on the insulation film 26 by a photographic etching method and the $SiO_2$ film above tungsten of the contact 24 and local interconnect 23 is selectively etched by anisotropic etching. Then, only the SiN film of the bottom of the 1Via is selectively etched and, for example, Ti is deposited on the bottom of the 1Via in a thickness of 10 nm by sputtering. Thereafter, for instance, heat treatment is carried out at 600° C. for 30 minutes in a $N_2$ atmosphere to form TiN on the surface of Ti. After tungsten is deposited in a thickness of 400 nm by a CVD method, tungsten on the $p-SiO_2$ film is removed by a CMP method and the 1Via opening is filled up with a tungsten film 27 (FIG. 15).

Next, AlCu with a thickness of 400 nm and Ti/TiN with thicknesses of 5 nm/60 nm are deposited on the insulation film 26. On these deposits, a photoresist pattern is formed by photographic etching. Using the photoresist pattern as a mask, these metal films are etched by anisotropic etching to form a wiring 28. A silicon oxide film ($SiO_2$) film 29 with a thickness of about 500 nm is deposited as an interlayer insulation film by a p-CVD method. On the silicon oxide film 29, a photoresist pattern for forming a 2Via is formed by photographic etching. The silicon oxide film 29 is selectively etched by anisotropic etching to form the 2Via. On the silicon oxide film 29, for example, Ti/TiN with a thickness of about 10 nm is deposited at the bottom of the 2Via by sputtering. After tungsten is deposited in a thickness of 400 nm on the silicon oxide film 29 by a CVD method, tungsten W on the silicon oxide film 29 is removed by a CMP method and the 2Via opening portion is filled up with a tungsten film 30. Thereafter, AlCu with a thickness of 400 nm and Ti/TiN with thicknesses of 5 nm/60 nm are deposited on the silicon oxide film 29. On these deposited films, a photoresist pattern is formed by photographic etching. Using the photoresist pattern as a mask, anisotropic etching is carried out to form a wiring 31 consisting of these films (FIG. 16).

The production process for the SRAM is as mentioned above. The cell size of the SRAM in the direction of X is determined by pitches of the tungsten film to be used as the local interconnect 23 and contact 24 as shown in the sectional structure of the SRAM cell of FIG. 9. Hence, as shown in FIG. 7, a region where the contact 24 above the gate electrode is to be formed must be formed in such a large size that the pattern of the gate electrode 42 in which a contact hole is opened has a sufficient margin in consideration of an alignment error in a lithographic process for forming the photoresist pattern of the gate electrode 42 and the contact hole. On the other hand, there is a strong demand for miniaturization of the gate length of a MOS transistor used for a cell with the view of improving the performance of the SRAM. Therefore in this case, it is necessary to make a fine pattern which can be realized using the most advanced modern lithographic technique. Because of the above reason, in the SRAM cell, each gate length (which means the width of the pattern of a gate electrode) of the load transistor (p-MOS transistor) and drive transistor must be made to be fine and the width of a gate electrode which is sandwiched between these transistors and in which a contact is opened must be large.

An introduction of a high temperature and accelerated process along with a recent development in fine technologies makes it possible to activate impurity atoms introduced into a semiconductor substrate while the impurity atoms are restrained more strictly from diffusing from the distribution formed when the impurity atoms are introduced by ion-implantation. Further, in the formation of an element isolated region, an introduction of STI (Shallow Trench Isolation) in place of customary selective oxidation (LOCOS process) makes it possible to reduce a well interval, namely, an interval between an nMOS transistor and a pMOS transistor. The introduction of the above processes results in a reduction in the distance in which a gate electrode portion of the MOS transistor and a contact hole are formed. As to the direction of Y in a cell, in turn, there is a large problem of the fidelity of the tip of the gate electrode to a pattern in a lithographic step. This is because alignment precision between layers must be taken into account since the pattern of the gate electrode is formed after element regions are formed and further, when an alignment error is produced, the gate length of the tip of the MOS transistor is narrowed, making it difficult to control the threshold voltage by a variation of the dimension of the tip on account of the short channel effect of the MOS transistor.

As mentioned above, techniques which greatly contributes to miniaturization to materialize fine cells of SRAMs depend on how to overcome the effect of a large line width, in which a contact hole arranged close to a gate electrode is opened, to achieve miniaturization in the direction of X and on how to overcome the effect of tapering of a gate tip to achieve miniaturization in the direction of Y.

FIG. 17 is a view of a cell layout of an example of a customary SRAM and FIG. 18 is a view showing the result of lithographic simulation with respect to a pattern of a gate electrode of a cell layout of an example of a customary SRAM. As shown in FIG. 17, the layout of the SRAM includes a gate electrode pattern 10 and an impurity diffused region pattern 11 which becomes a source/drain region. The gate electrode pattern 10 comprises patterns 1, 2, 3, 1', 2' and 3'. The patterns 1, 2, 3 and the patterns 1', 2', 3' respectively constitute different SRAM cells. The patterns 1 and 2 constitute a load transistor (pMOS transistor) and a drive transistor (nMOS transistor) respectively and the pattern 3 constitutes a pair of transfer transistors (nMOS transistor). The impurity diffused region pattern 11 is constituted of n-type patterns 4, 5, 8 and 9 and p-type patterns 6 and 7. When the cell layout of such an SRAM is formed exactly, if, for instance, in a step of forming a gate electrode, a photoresist on the semiconductor substrate 12 is exposed for patterning by using a reticle pattern having the same shape as the gate electrode pattern 10 shown in FIG. 17, a gate electrode pattern 13 of the photoresist as shown in FIG. 18 is formed. Such a pattern is formed repeatedly on the semiconductor substrate to form the SRAM. A gate electrode having the same shape as this pattern is formed on the semiconductor substrate 12. The impurity diffused region which becomes a source/drain region of a transistor is likewise formed on the semiconductor substrate 12 in the same shape as the impurity diffused region pattern 14 of the photoresist shown in FIG. 18.

Here, the structure of the SRAM cell comprising six transistors will be explained with reference to FIG. 19. FIG. 19 is a circuit diagram of the SRAM cell. As shown in this figure, the SRAM cell comprises a pair of transfer transistors (nMOS transistors) Q1 and Q2, a pair of drive transistors (nMOS transistors) Q3 and Q4, and a pair of load transistors (pMOS transistors) Q5 and Q6. A pair of data lines of the SRAM are connected respectively to each drain/source of the transfer transistors Q1 and Q2. Gate electrodes are integrated among themselves and used as a word line. A source/drain of the transfer transistor Q1 is connected to a source/drain of the drive transistor Q3, to a source/drain of the load transistor Q5 and to gate electrodes of the drive transistor Q4 and load transistor Q6. A source/drain of the transfer transistor Q2 is connected to a source/drain of the drive transistor Q4, to a source/drain of the load transistor Q6 and to gate electrodes of the drive transistor Q3 and load transistor Q5.

The drain/source of the drive transistor Q3 is grounded and the drain/source is connected to the source/drain of the load transistor Q5 and the gate electrode is connected to the gate electrode of the load transistor Q5. The drain/source of the drive transistor Q4 is grounded and the drain/source is connected to the source/drain of the load transistor Q6 and the gate electrode is connected to the gate electrode of the load transistor Q6. Moreover, each source/drain of Q5 and Q6 is connected to a power source Vcc.

The SRAM cell has the structure as mentioned above, wherein a pair of transfer transistors (access transistors) Q1 and Q2 in which the word line is used as a gate input are connected to a memory node and exchanges reading and writing data with a bit line through the transfer transistors Q1 and Q2. The word line is used for the output of a row decoder circuit and is usually formed of a wiring of a low resistance polysilicon layer. It is turned to level 1, only when the memory cell is selected, to turn on the transfer transistors Q1 and Q2. A pair of bit lines are set to the same voltage level in advance before the memory cell is selected so that data of a memory cell which has been selected before is protected so as not to be written in a newly selected memory cell. In the case of a write cycle, writing data transferred to a pair of bit lines corresponding to the data of the accessed memory cell is written in a memory cell through the transfer transistors Q1 and Q2.

Each portion of the cell layout has a dose/focus margin enough to attain a processing tolerance of less than ±10% of a target dimension. Optimum lithographic conditions for securing the dimension of a pattern of each portion of the SRAM cell are, in turn, different from each other. The widths A and B of the gate electrode in FIG. 18 represent the gate lengths of the drive transistor of the SRAM cell. A low level exposure condition is required to optimize the dimension of the width A of the end of the gate electrode. To the contrary, in the portion of the width B, the dimension tends to be wide by the effect of a gate electrode pattern which is widened to make contact with a metal wiring on the adjacent gate electrode. To avoid this effect and to form a photoresist pattern in accordance with a design, a high level exposure condition is required. Moreover, a process for the production of a semiconductor device involves repetition of many lithographic steps. So an alignment error with the pattern which has been formed in the previous steps is produced in a lithographic step. Hence it is demanded of the dimensional control of a MOFSET to form the MOFSET in a limited range taking an alignment error into account even in areas other than element regions.

As is mentioned above, when the fidelity of a reproduced pattern is worsened in a lithographic process, the gate length of one MOSFET formed on an element region as shown in FIG. 18 is changed in the course of the process. When the gate length is thereby made short, there is a problem that a remarkable reduction in the threshold value is caused by the short channel effect of the MOSFET, causing an inferior action of the cell. Even when the gate length is widened to the contrary, there is also a problem that the driving capability of current is reduced, leading to reduced operational speed. To overcome this problem, the gate electrode pattern may be extended to the side of the element region to increase the quantity of fringe, thereby improving the fidelity of a pattern. However, this makes the cell area increase with the result that the chip area increases. This fact shows that although simple lines and fine lines can be processed by fine processing techniques, it is difficult to proceed with miniaturization of a complex pattern such as that of an SRAM cell in a step of forming a technologically complex pattern without technologies for resolving the complex pattern.

The above problem will be explained with reference to FIGS. 20A and 20B. FIGS. 20A and 20B are each a top plan view of a reticle pattern and photoresist pattern formed based on the reticle pattern. A reticle pattern 15 forms a common gate electrode which forms, for instance, a drive transistor (nMOS transistor) and a load transistor (pMOS transistor) of an SRAM. In the center of the common gate electrode, contacts for wiring on the element region are formed close to each other. Hence the center portion is made convex, increasing the width of this portion of the gate electrode. When, using this reticle pattern 15, a photoresist is exposed to carry out lithographic treatment, a photoresist pattern 16 with the corner portions having a round shape unlike the reticle pattern is formed (FIG. 20A). This is because the dimension of the gate electrode portion of the MOS transistor is changed on account of a proximity action in lithography, an alignment error with a base element region and a loading effect of etching by the influence of the aforementioned region with a gate electrode increased in width.

The phenomenon observed here is produced since the corner portions are all transferred into a round shape. As measures to overcome this problem, conventionally a selif pattern is added to the corner as required. Specifically, a selif pattern 17 is added to a projecting portion and a notch having a selif pattern 18 is formed at the corner in a concave portion. If patterning of a photoresist is made in the above manner, a photoresist pattern 16 is formed in which the round shape is corrected and which is reduced in error (FIG. 20B).

However, fine shape to which such a selif pattern must be added increases workloads very greatly in the designing of the layout, causing an increase in design loads. This tendency has been promoted with the progress of miniaturization of semiconductor devices.

Particularly SRAMs which are highly integrated, namely, increased greatly in capacity have been achieved as the result of research and development of fine processing techniques as stated above. Techniques such as the use of light with shorter wavelengths and high resolution techniques in lithographic techniques for forming an element pattern play an important role in and contribute to this fine processing. These methods, however, have a large effect on the formation of a simple and fine line used for elements and wirings and its space, but make it difficult to keep the same scaling trend as in the formation of a simple line and space in view of advancement in dimensional accuracy in the longitudinal direction of a fine line and the fidelity of a pattern with a complex shape. From these reasons, in SRAM cells in which a memory cell comprises six MOS transistors and which requires a complex layout, an improvement in the fidelity of a pattern poses a large problem on the miniaturization of a cell area.

BRIEF SUMMARY OF THE INVENTION

The present invention has been made in view of the above situation and has an object of providing a process for producing a semiconductor device using a gate electrode such as an SRAM, wherein a gate electrode pattern is exactly formed with fidelity to a reticle pattern through no complicated layout design and with the area thereof being reduced more greatly than that of a conventional gate electrode pattern and also providing a semiconductor device produced by this process.

The invention is characterized in that, in a lithographic step using a reticle pattern formed with a gate electrode pattern having a substantially linear form, a convex portion in which at least a part of a contact region is arranged is formed in almost the center of the long side of the linear gate electrode pattern and a concave portion is formed on the side opposite to the convex portion such that at least all projecting sides of the convex portion face the concave portion between transistor regions of the reticle pattern. In miniaturizing techniques, the fidelity of a pattern in a step of producing a semiconductor device can be improved by the above reticle pattern having a concave portion. The use of this invention in, for instance, an SRAM pattern renders it possible to improve processing dimensional accuracy of a gate electrode, the performance and the reliability and to promote the miniaturization of the size of a memory cell since it is unnecessary to make the size long to eliminate a variation in gate length.

Specifically, the process for producing a semiconductor device according to the present invention comprises a step of forming a gate electrode on a semiconductor substrate by performing a lithographic step using a reticle pattern provided with a substantially linear gate electrode pattern which comprises two transistor regions and contact regions formed between these transistors, and has paired first and second long sides and a pair of short sides, wherein a projecting portion in which at least a part of the contact region is arranged is included in the first long side and a concave portion facing at least the entire length of the projecting portion is included in the second long side facing the first long side between the transistor regions of the reticle pattern. The length of the concave portion parallel to the second long side may be longer than the length of the concave portion parallel to the first long side and the width of the concave portion parallel to the short side may be smaller than the diameter of the contact region. The gate electrode may be used as a gate electrode of a drive transistor and load transistor which constitute an SRAM memory cell. A drain of the drive transistor may be electrically connected to a drain of the load transistor through a metal wiring which is formed directly on the semiconductor substrate. The distance between the convex portion and the concave portion may be designed to be shorter than the width of the gate electrode constituting a MOS transistor of the transistor region.

An additional selif pattern may be formed on at least one top portion of the gate electrode pattern except for the convex and concave portions. The above gate electrode of the invention may be used as a transfer transistor constituting an SRAM memory cell, wherein the conversion to a reticle dimension from a design gate length representing the width of a gate electrode of a transistor having a gate electrode having the same pattern as the above convex and concave portions may be made such that a gate length representing the width of a gate electrode of the transfer transistor is converted into the reticle dimension in a small conversion ratio to a design value.

The semiconductor device of the present invention comprises a semiconductor substrate and a substantially liner gate electrode pattern which is formed on the semiconductor substrate, is provided with two transistor regions and contact regions formed between these transistor regions and has paired first and second long sides and a pair of short sides, wherein a projecting portion in which at least a part of the contact region is arranged is included in the first long side and a concave portion facing at least the entire length of the projecting portion is included in the second long side facing the first long side between the transistor regions of the gate electrode pattern. The length of the concave portion parallel to the second long side may be longer than the length of the convex portion parallel to the first long side and the width of the concave portion parallel to the short side may be smaller than the diameter of the contact region. The gate electrode may be used as a gate electrode of a drive transistor and load transistor which constitute an SRAM memory cell. A drain of the drive transistor may be electrically connected to a drain of the load transistor through a metal wiring which is formed directly on the semiconductor substrate.

The selif pattern is a support pattern improving the fidelity of the shape of a pattern edge by adding a pattern smaller than the maximum design dimension to the corners and the concave portion is a support pattern which improves the capability of controlling the dimension of a pattern by using a large width to limit the influence of a projecting portion of the pattern to a minimum and is arranged at the side portion of a reticle pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be explained with reference to the drawings.

Firstly, a first embodiment will be explained with reference to FIG. 1 to FIG. 3.

Figure 19:
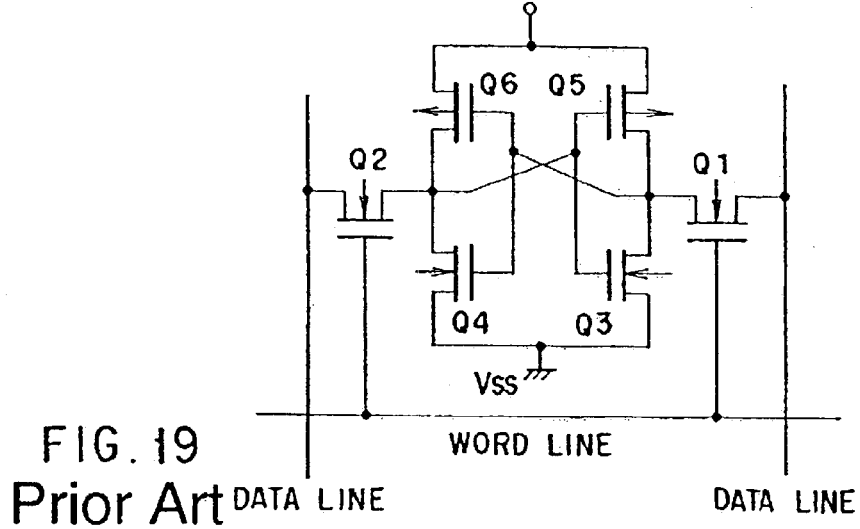
FIG. 19 is circuit diagrams of a memory cell of the present invention and a customary cell.
Figure 20A:
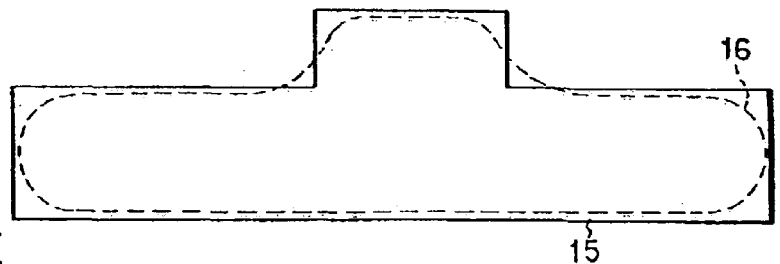
FIGS. 20A and 20B are each a partly top plan view showing the structure in which a customary reticle pattern and a photoresist pattern formed on the basis of the reticle pattern are overlapped on each other.
Figure 20B:
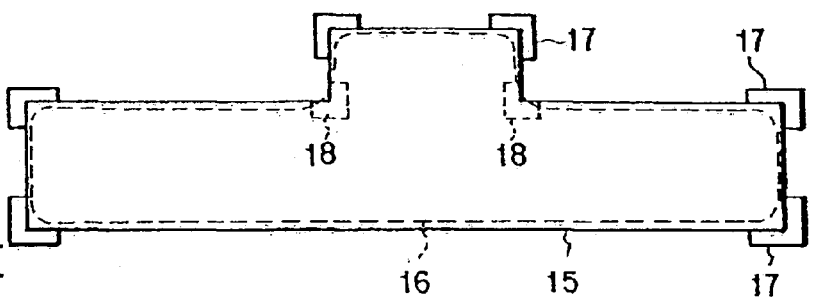
Figure 21:
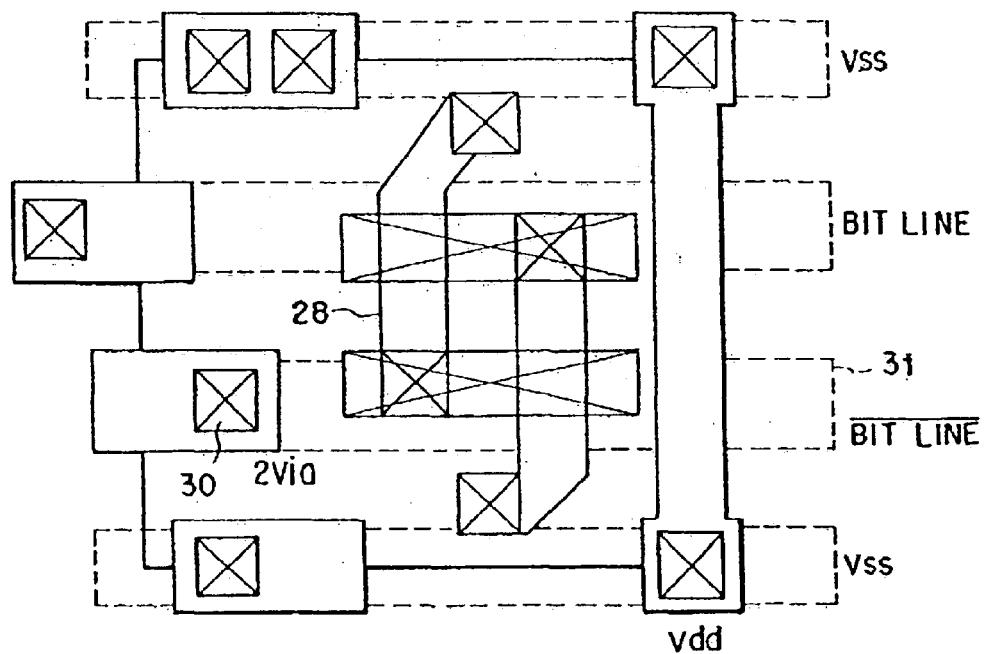
FIG. 21 is a top plan view showing a wiring portion of the cell layout of the SRAM of FIG. 7.
Figure 22:
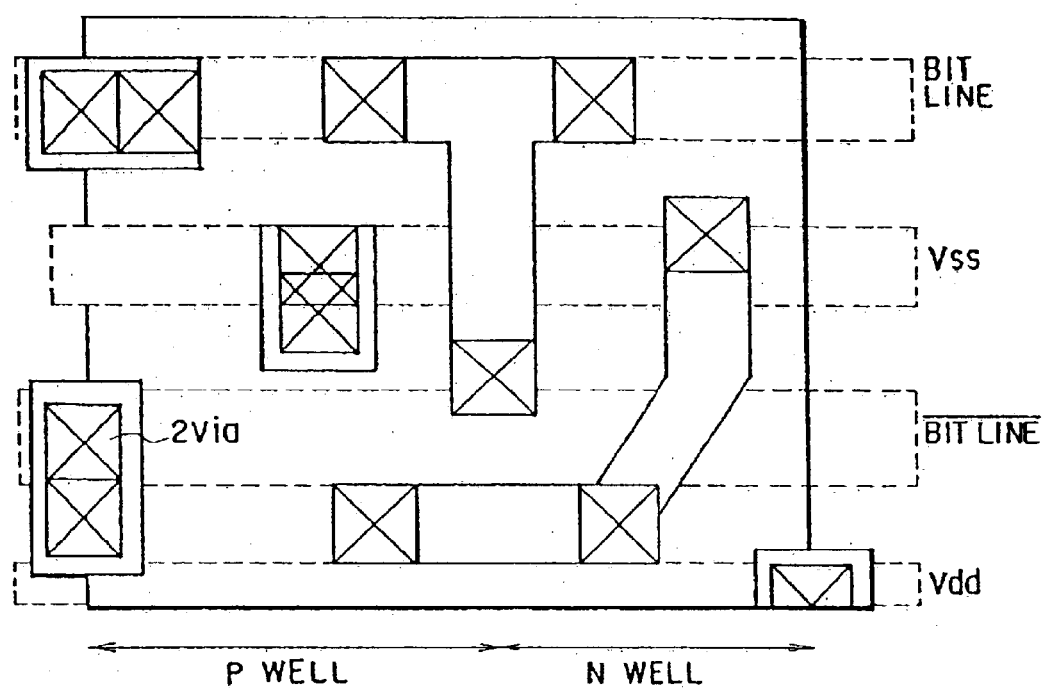
FIG. 22 is a top plan view showing a wiring portion of a cell layout of an SRAM of FIG. 8.

Explanations of this embodiment refers to an SRAM formed with six MOSFETs in one memory cell as shown in FIG. 19. FIG. 1 is a top plan view showing a cell layout of the SRAM and FIG. 2 is a top plan view showing the result of lithographic simulation with respect to the pattern of a gate electrode of a cell layout of the SRAM.

Figure 1:
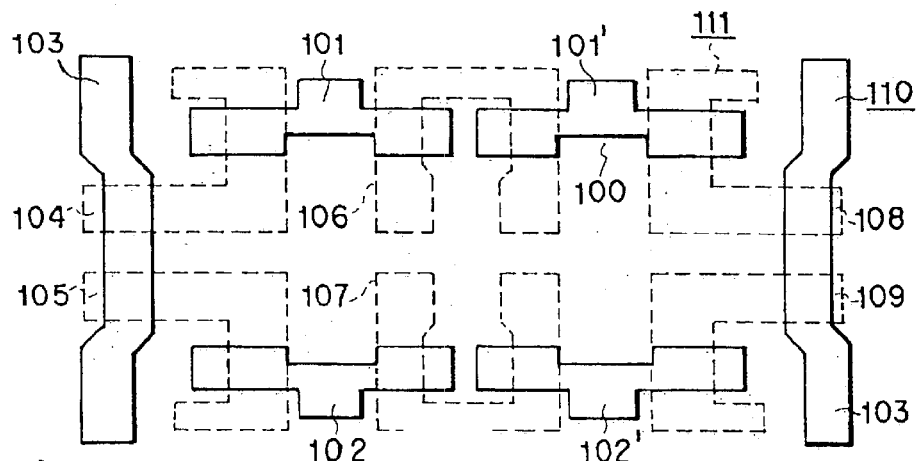
FIG. 1 is a view showing a cell layout of an SRAM of a first embodiment.

As shown in FIG. 1, the cell layout of the SRAM includes a gate electrode pattern 110 and an impurity diffused region pattern 111 to be formed as a source/drain region. The gate electrode pattern 110 comprises patterns 101, 102, 103, 101', 102' and 103'. The patterns 101, 102, 103 and the patterns 101', 102', 103' respectively constitute different SRAM cells. The patterns 101 and 102 constitute a load transistor (pMOS transistor) and a drive transistor (nMOS transistor) respectively and the pattern 103 constitutes a pair of transfer transistors (nMOS transistor). The impurity diffused pattern 111 is constituted of n-type patterns 104, 105, 108 and 109 and p-type patterns 106 and 107.

Figure 2:
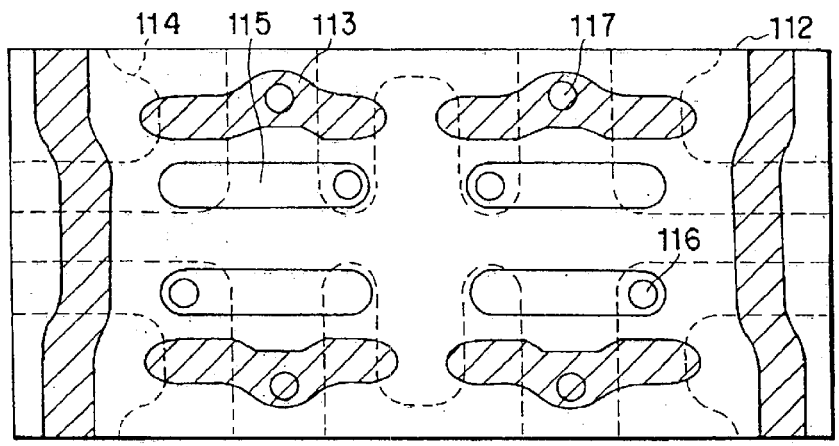
FIG. 2 is a view showing the result of lithographic simulation with respect to a pattern of a gate electrode of a cell layout of a second SRAM.

When it is intended to form the cell layout of such an SRAM exactly, if, for instance, in a step of forming a gate electrode, a photoresist on the semiconductor substrate 112 is exposed for patterning by using a reticle pattern having the same shape as the gate electrode pattern 110 shown in FIG. 1, the photoresist is patterned and a gate electrode pattern 113 with the same pattern is formed as shown in FIG. 2. Such a gate electrode pattern 113 is formed repeatedly on the semiconductor substrate 112 to form the SRAM. In the same manner, a photoresist pattern is formed on the semiconductor substrate 112 from the impurity diffused region pattern of the reticle pattern and an impurity diffused region 114 which has the same shape as the photoresist pattern and is to be used as a source/drain region is formed.

Each of the patterns 101, 101', 102 and 102' among the electrode pattern 110 shown in FIG. 1 is a rectangular which is longer in a lateral direction. Each of these patterns has a convex portion in almost the center of one of the long sides and a concave portion 100 is formed on the opposite side so as to face the side of the projecting convex portion. The depth of the concave portion is in a range between 0.1 $\mu$m and 0.175 $\mu$m and the width of the gate electrode pattern 110 is 0.3 $\mu$m.

When the gate electrode pattern is formed on the semiconductor substrate by using the gate electrode pattern of the reticle pattern, the width (which represents the gate length of a transistor) of the gate electrode pattern which is overlapped on a transistor region is compensated by the concave portion and hence shows a constant value without any fluctuation. The gate electrode pattern 113 contains element regions constituting one load transistor and drive transistor respectively on both ends thereof. A contact region 117 is formed in the center where the convex portion which is formed between these element regions is arranged. A gate electrode of the one load transistor and drive transistor is connected via the contact region to a wiring which is electrically connected to each drain region of another load transistor and drive transistor. On the other hand, a local interconnect 115 which connects the drains of these load transistor and drive transistor to each other is formed close to the gate electrode pattern 113 directly on the semiconductor substrate 112. The local interconnect is formed with a contact 16. Since a convex portion 118 formed in the gate electrode pattern 113 allows the interval between these contacts to be larger than that in a conventional structure in which contacts are formed close to each other, the local interconnect can be formed closer to the gate electrode pattern.

Figure 3:
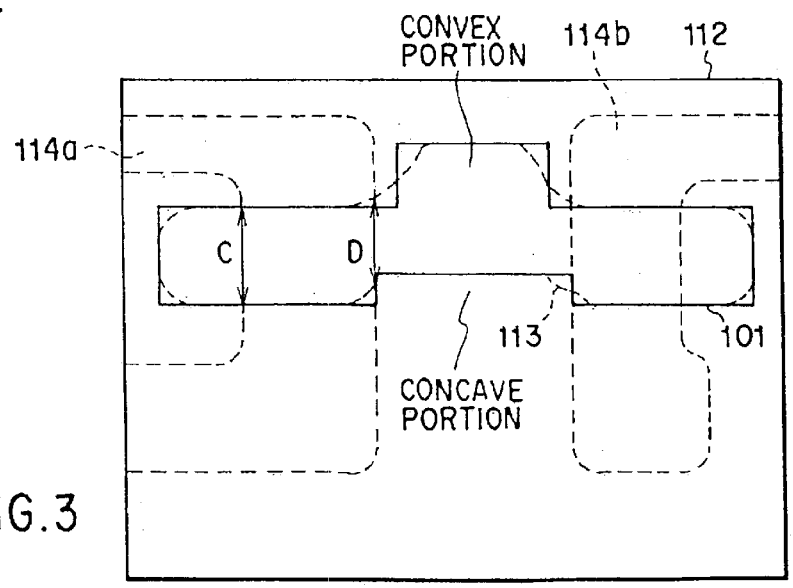
FIG. 3 is a top plan view showing the structure in which a gate electrode pattern of a cell layout of an SRAM is overlapped on the pattern of an impurity-diffused region and pattern of an gate electrode which are formed on a semiconductor substrate of the first embodiment.

FIG. 3 is a top plan view showing the structure in which a gate electrode pattern of a cell layout of an SRAM is overlapped on the pattern of an impurity diffused region and pattern of an gate electrode which are formed on the semiconductor substrate. FIG. 3 is an enlarged view of a part of the semiconductor substrate formed with the impurity diffused region and the gate electrode pattern shown in FIG. 2.

On the semiconductor substrate 112, two impurity diffused regions 114a, 114b which become a source region and drain region of a transistor respectively are formed. The gate electrode pattern 113 is formed and arranged such that the impurity diffused regions 114a, 114b are overlapped on both ends thereof respectively. A view when the gate electrode pattern 101 of the cell layout of the SRAM which is a base forming the gate electrode pattern 113 is overlapped on the gate electrode pattern 113 is as shown in FIG. 3. To state in more detail, the gate electrode 101 of the cell layout of the SRAM has a convex portion and a concave portion arranged corresponding to the convex portion. An increase in the width of the gate electrode on account of the formation of the convex portion is offset by a reduction in the width of the gate electrode due to the formation of the convex portion. The width D (which corresponds to the gate length of a transistor) of the gate electrode close to the convex portion above the edge of the impurity diffused region on which the gate electrode overlaps is spaced apart from the convex portion so that the width D is not affected by the convex portion. Also, the width D is substantially the same as the width C (which corresponds to the gate length of the same transistor) of the gate electrode above the opposite edge of the impurity diffused region on which the gate electrode overlaps. Therefore, a variation in the transistor characteristics is eliminated and a transistor is formed exactly in accordance with the design.

As mentioned above, in this embodiment, the processing accuracy of the gate dimension of the MOS transistor portion to be formed can be improved by the correcting pattern (the gate electrode pattern having the convex portion) used for improving fidelity (reproducibility) in the process of the production of the layout pattern shown in FIG. 1. The introduction of this correcting pattern renders it possible to make an improvement in the control of the dimensions of both ends of the gate electrode in the MOS transistor (in the case of positive type resists, the condition of exposure of the region provided with a wedge may be set to a lower side). This produces an effect of improving shortening of the gate electrode in the longitudinal direction.

Next, a second embodiment will be explained with reference to FIG. 4.

Figure 4:
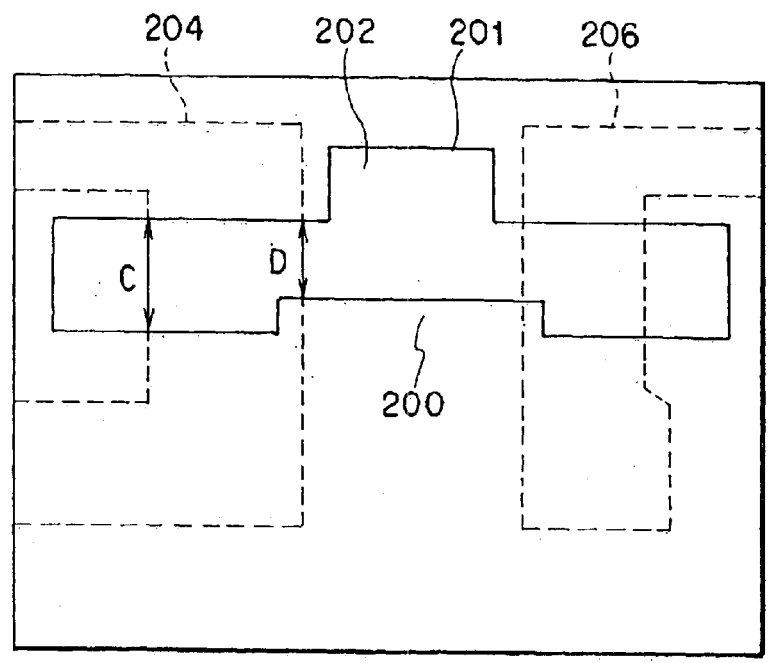
FIG. 4 is a view showing a cell layout of an SRAM of a second embodiment.

FIG. 4 is a top plan view showing a part of a cell layout of an SRAM.

The cell layout of the SRAM includes a gate electrode pattern 201 and an impurity diffused region pattern 204 to be formed as a source/drain region. A impurity diffused region pattern 206 constitutes a load transistor (pMOS transistor) and the impurity diffused region pattern 204 constitutes a drive transistor (nMOS transistor). A convex portion 201 characterizing the present invention is formed on one side of the gate electrode pattern 201 for a contact region and a concave portion 200 formed on the opposite side so as to face the convex portion 202 partly overlaps on the impurity diffused region patterns 204, 206. When the cell layout of such an SRAM is formed exactly, if, for instance, in a step of forming a gate electrode, a photoresist on the semiconductor substrate is exposed for patterning by using a reticle pattern having the same shape as the gate electrode pattern 201 shown in FIG. 4, the photoresist is patterned and a gate electrode pattern with the same pattern is formed on the semiconductor substrate. Such a gate electrode pattern is formed repeatedly on the semiconductor substrate to form the SRAM cell. In the same manner, a photoresist pattern is formed on the semiconductor substrate from the impurity diffused region pattern of the reticle pattern and an impurity diffused region which has the same shape as the photoresist pattern and is to be used as a source/drain region is formed.

By extending the position of the concave portion optionally in this manner, the widths of the C and D portions of the gate electrode pattern on the layout as shown in FIG. 4 can be designed to be substantially equal to each other when these portions are actually formed as a gate electrode pattern on a semiconductor substrate. As a consequence, each processing dimensional accuracy of the width of the gate electrode in the center portion of the gate electrode forming the drive transistor and load transistor which constitute a memory cell in the SRAM and of the width of the gate electrode of the transistors formed on each end of the gate electrode can be improved.

Next, a third embodiment will be explained with reference to FIG. 5.

Figure 5:
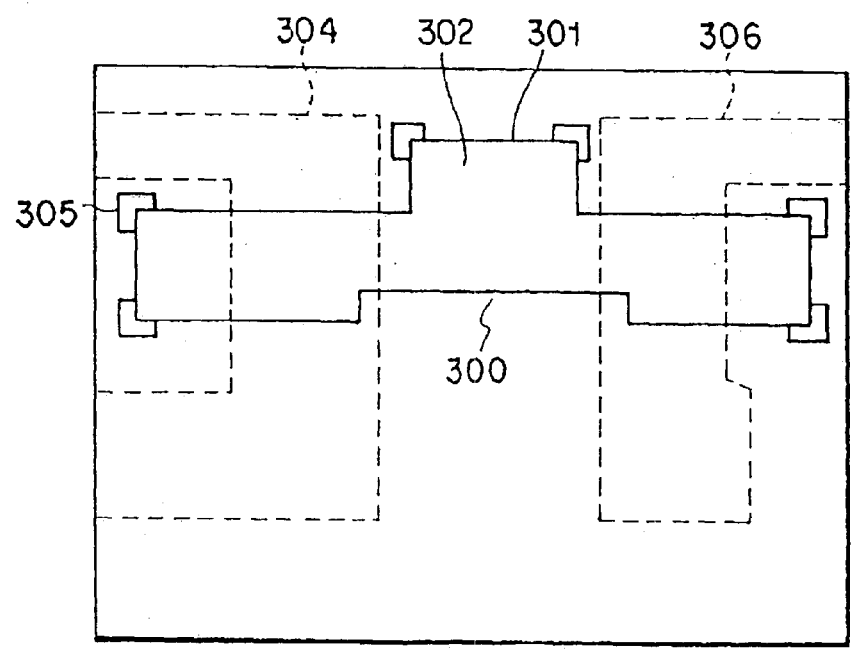
FIG. 5 is a view showing a cell layout of an SRAM of a third embodiment.

FIG. 5 is a top plan view showing a part of a cell layout of an SRAM.

The cell layout of the SRAM includes a gate electrode pattern 301 and impurity diffused region patterns 304, 306 to be formed as source/drain regions. The impurity diffused region pattern 306 constitutes a load transistor (pMOS transistor) and the impurity diffused region pattern 304 constitutes a drive transistor (nMOS transistor). A convex portion 302 characterizing the present invention is formed on one side of the gate electrode pattern 301 for a contact region and a selif pattern 305 is formed on each corner of the gate electrode on which corner a concave portion 300 formed on the opposite side so as to face the convex portion 302 has no effect.

When it is intended to form the cell layout of such an SRAM exactly, if, for instance, in a step of forming a gate electrode, a photoresist on the semiconductor substrate is exposed for patterning by using a reticle pattern having the same shape as the gate electrode pattern 301 shown in FIG. 5, the photoresist is patterned and a gate electrode pattern with the same pattern is formed on the semiconductor substrate. Such a gate electrode pattern is formed repeatedly on the semiconductor substrate to form the SRAM cell. In the same manner, a photoresist pattern is formed on the semiconductor substrate from the impurity diffused region pattern of the reticle pattern and an impurity diffused region which has the same shape as the photoresist pattern and is to be used as a source/drain region is formed.

The phenomenon that only inexact transfer is made depending upon the shape of a reticle pastern appears especially on the corner of the reticle pattern. As measures for this problem, conventionally a selif pattern is added to each corner if necessary. In this embodiment, a selif pattern is likewise added to the corners on which the concave portion characterizing the present invention has no effect. If a photoresist is patterned in such a method, a photoresist pattern is formed in which the round shape is corrected and which is reduced in error.

The number of selif patterns to be added is smaller than in a conventional case and hence working load can be reduced compared with that of the conventional case. As a consequence, each processing dimensional accuracy of the width of the gate electrode in the center portion of the gate electrode forming the drive transistor and load transistor which constitute a memory cell in, especially, an SRAM and of the width of the gate electrode of the transistors formed on each end of the gate electrode can be improved.

Next, a fourth embodiment will be explained with reference to FIGS. 6A and 6B.

Figure 6A:
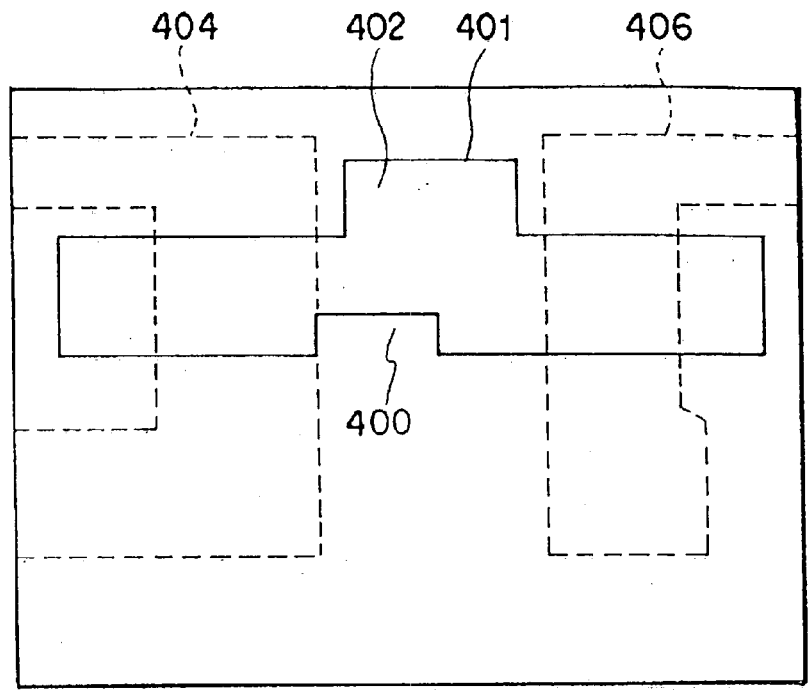
FIGS. 6A and 6B are each a view showing a cell layout of an SRAM of a fourth embodiment.
Figure 6B:
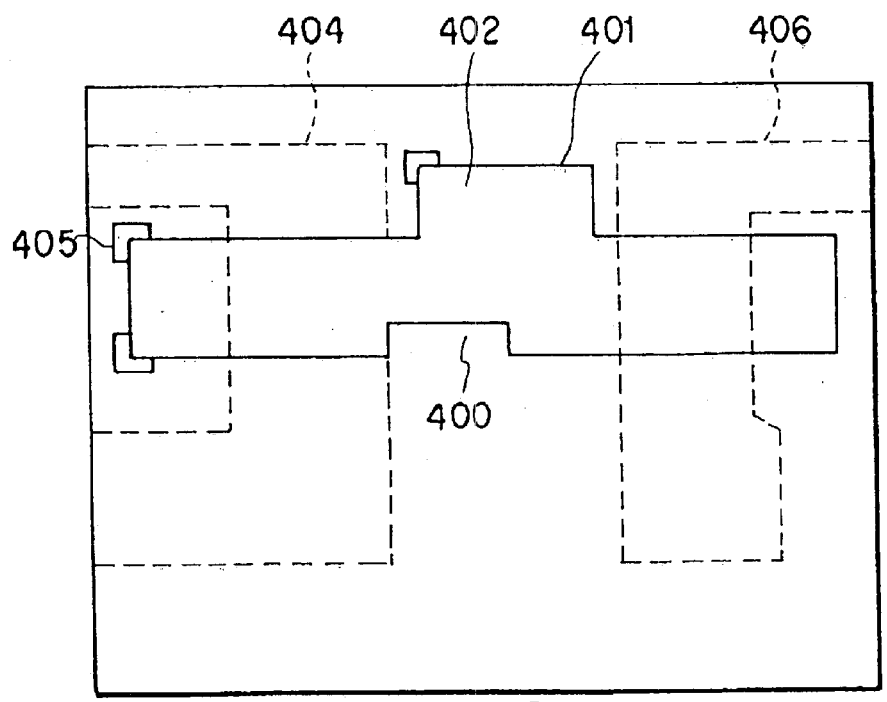
Figure 7:
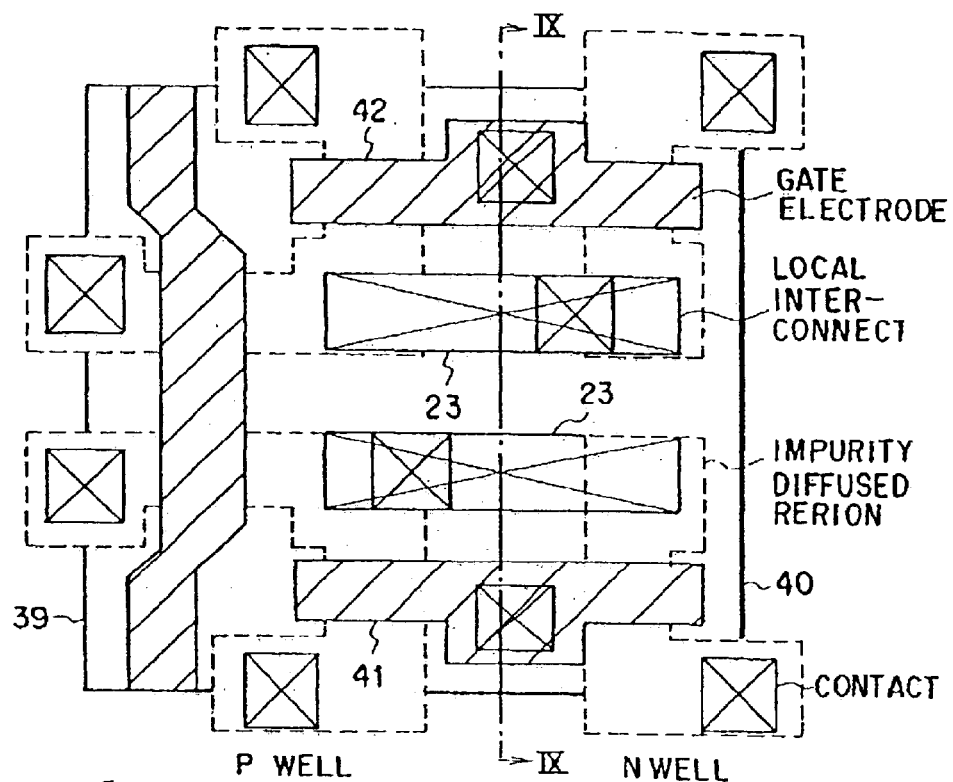
FIG. 7 is a top plan view of one unit memory cell of a customary SRAM.
Figure 8:
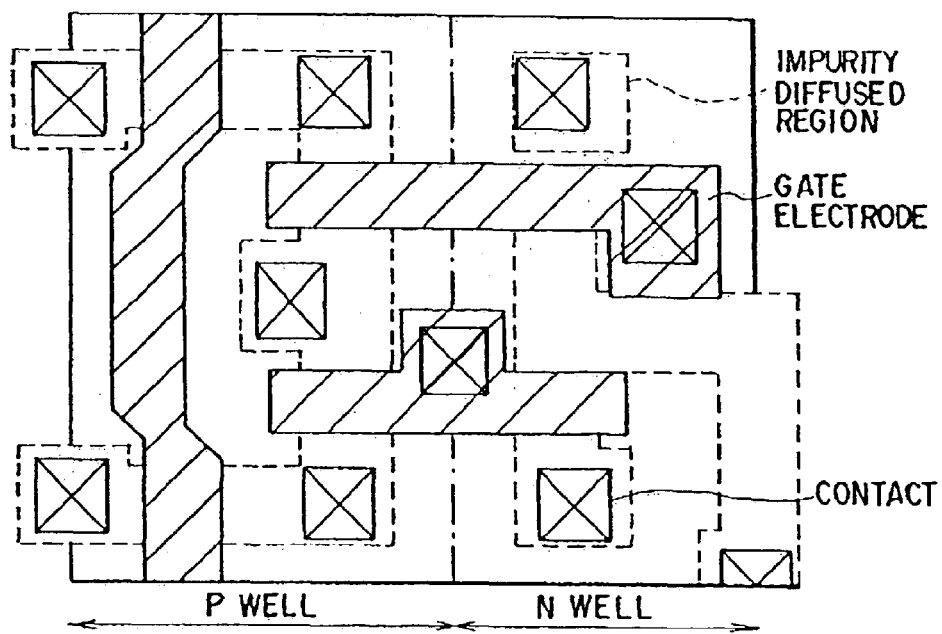
FIG. 8 is a top plan view of one unit memory cell of a customary SRAM.
Figure 9:
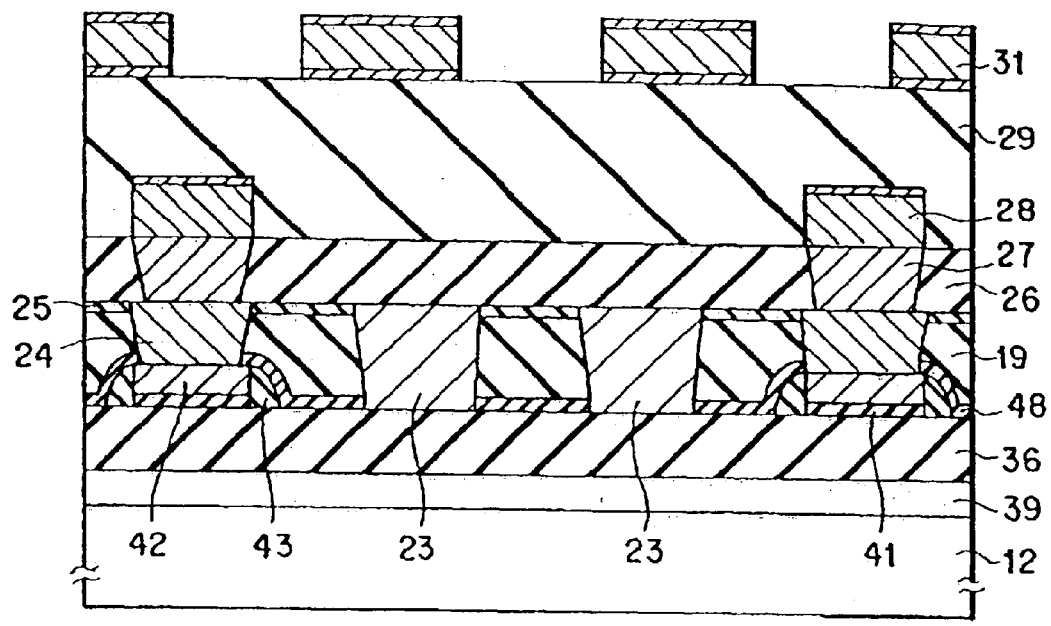
FIG. 9 is a sectional view of a portion along with the line IX—IX of FIG. 7.
Figure 10A:
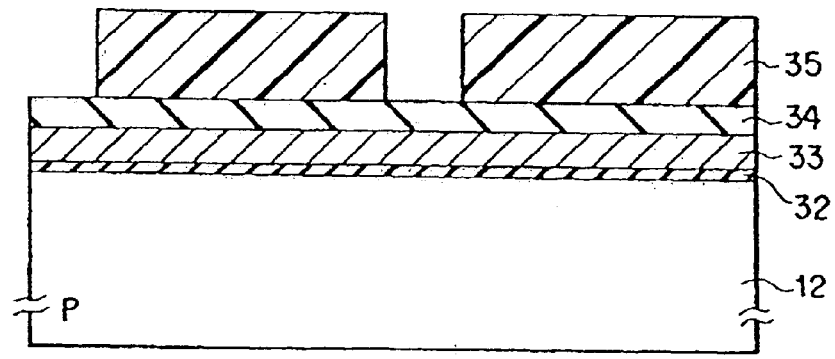
FIGS. 10A and 10B are each a sectional view of a production step for forming an SRAM of FIG. 7.
Figure 10B:
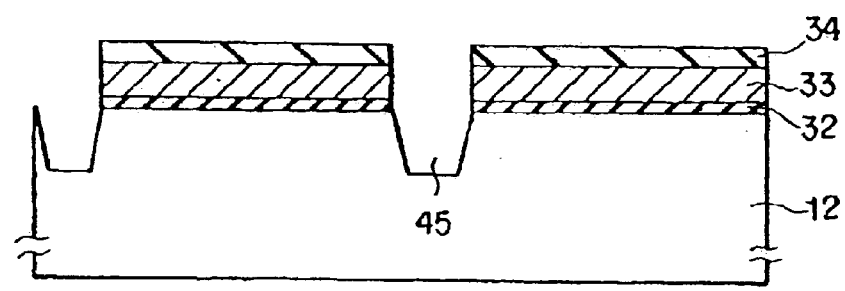
Figure 11A:
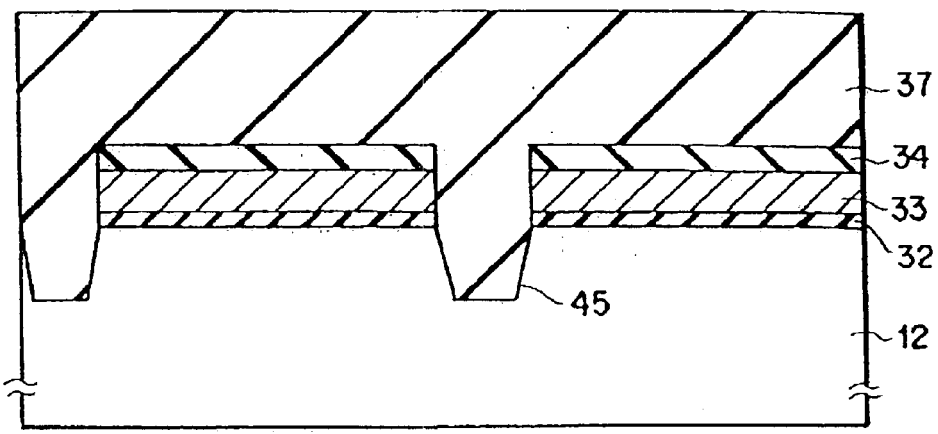
FIGS. 11A and 11B are each a sectional view of a production step for forming the SRAM of FIG. 7.
Figure 11B:
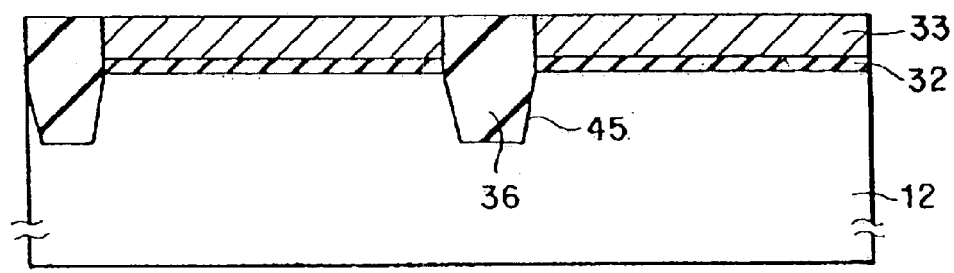
Figure 12A:
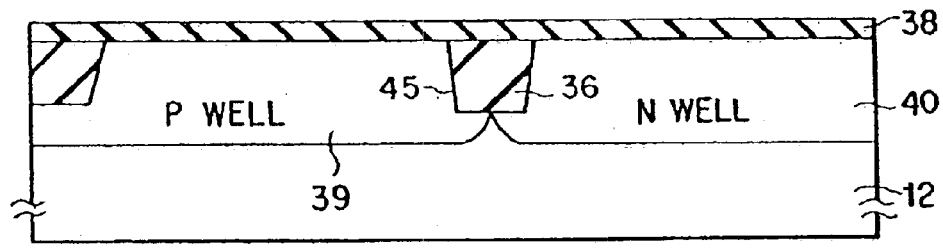
FIGS. 12A and 12B are each a sectional view of a production step for forming the SRAM of FIG. 7.
Figure 12B:
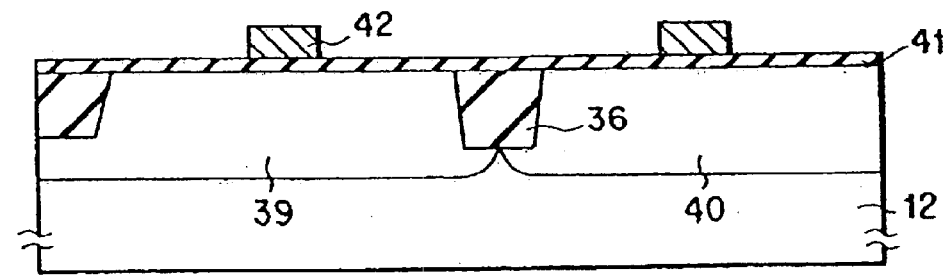
Figure 13A:
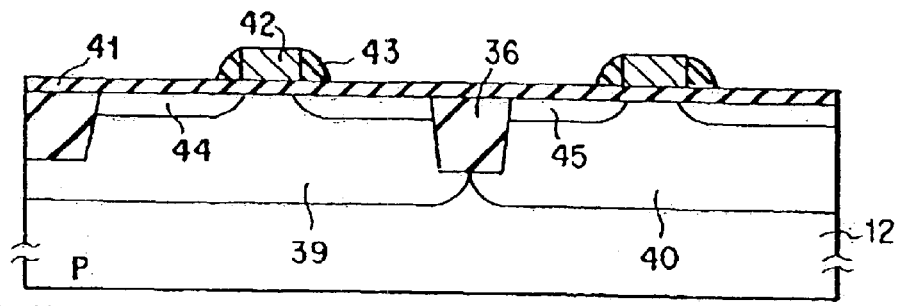
FIGS. 13A and 13B are each a sectional view of a production step for forming the SRAM of FIG. 7.
Figure 13B:
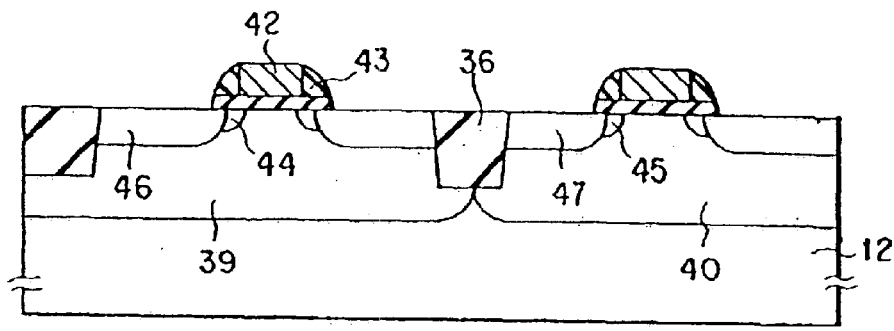
Figure 14A:
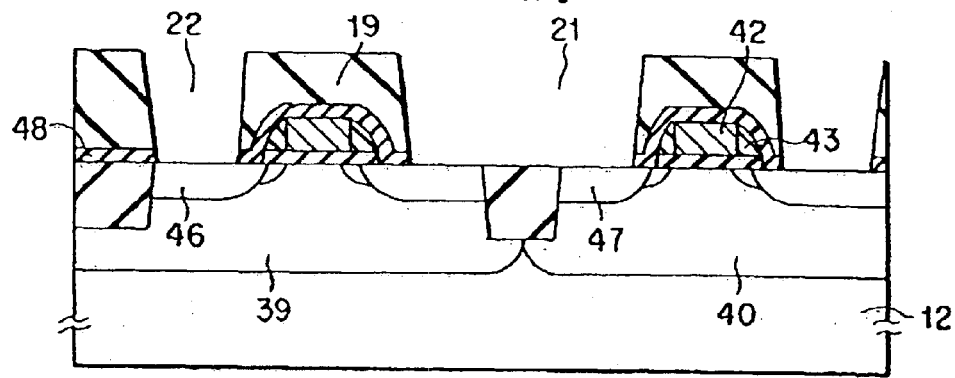
FIGS. 14A and 14B are each a sectional view of a production step for forming the SRAM of FIG. 7.
Figure 14B:
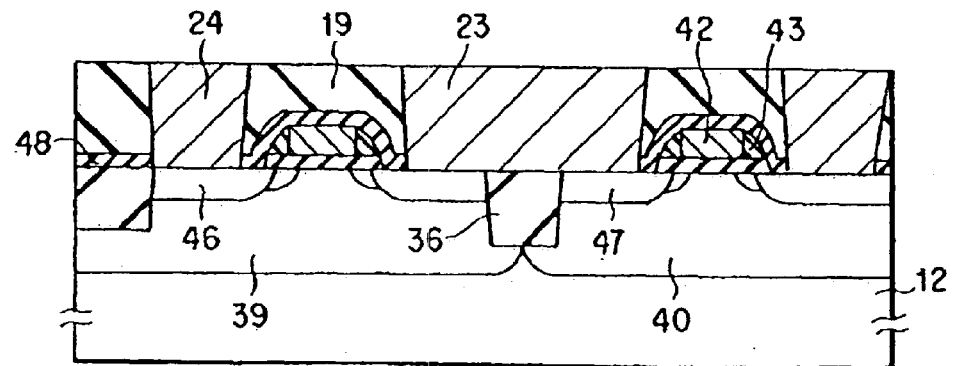
Figure 15:
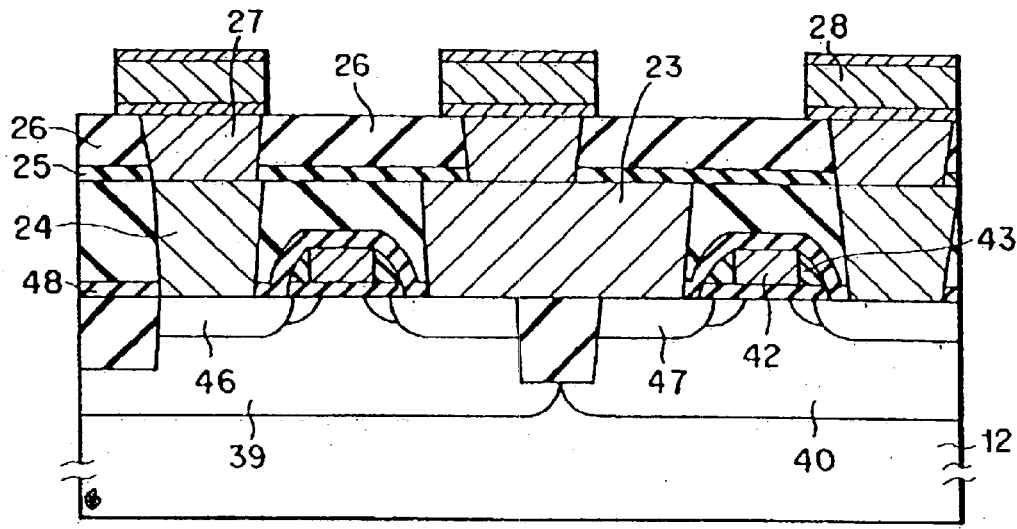
FIG. 15 is a sectional view of a production step for forming the SRAM of FIG. 7.
Figure 16:
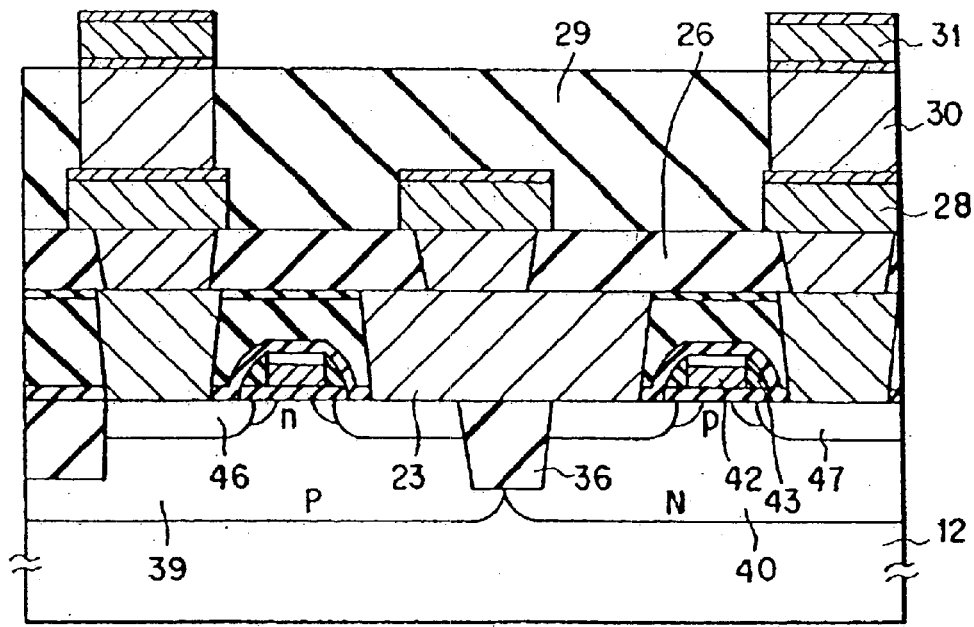
FIG. 16 is a sectional view of a production step for forming the SRAM of FIG. 7.
Figure 17:
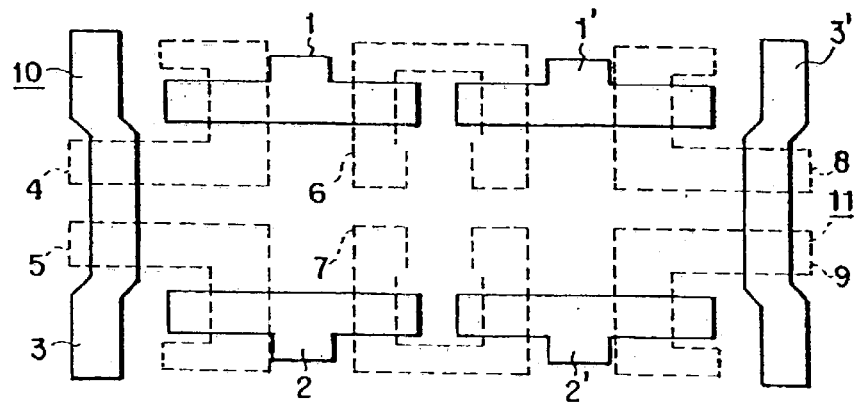
FIG. 17 is a top plan view showing a cell layout of a customary SRAM.
Figure 18:
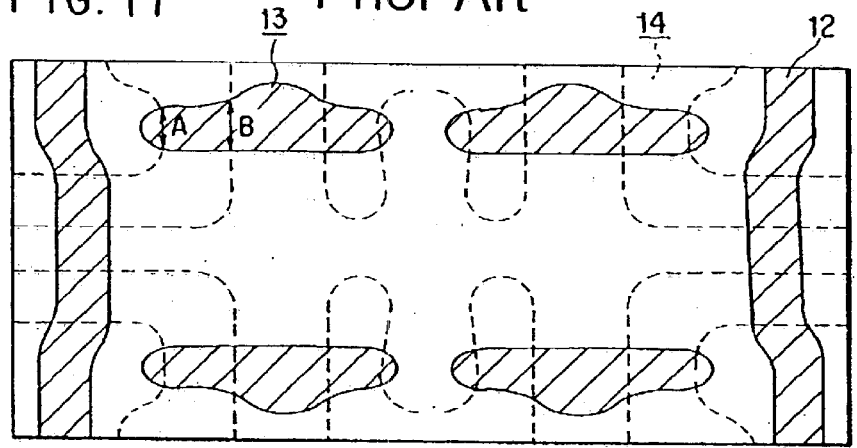
FIG. 18 is a view showing the result of lithographic simulation with respect to a pattern of a gate electrode of the cell layout of the SRAM of FIG. 17.

FIGS. 6A and 6B are each a top plan view showing a part of a cell layout of an SRAM. The cell layout of the SRAM includes a gate electrode pattern 401 and impurity diffused region patterns 404, 406 to be formed as source/drain regions. The impurity diffused region pattern 406 constitutes a load transistor (pMOS transistor) and the impurity diffused region pattern 404 constitutes a drive transistor (nMOS transistor). In this embodiment, a concave portion 400 is arranged so as to corresponds to the left side of a convex portion 401 and no convex portion is formed on the side of the impurity diffused region pattern 406 on which the load transistor is formed (FIG. 6A). Moreover, on the side of the impurity diffused region pattern 404 in which the drive transistor of the gate electrode pattern 401 is formed, the concave portion 400 is formed and a selif pattern 405 is also formed on each corner unaffected by the concave portion 400 (FIG. 6B).

When it is intended to form the cell layout of such an SRAM exactly, if, for instance, in a step of forming a gate electrode, a photoresist on the semiconductor substrate is exposed for patterning by using a reticle pattern having the same shape as the gate electrode pattern 401 shown in FIGS. 6A and 6B, the photoresist is patterned and a gate electrode pattern with the same pattern is formed on the semiconductor substrate. Such a gate electrode pattern is formed repeatedly on the semiconductor substrate to form the SRAM cell. In the same manner, a photoresist pattern is formed on the semiconductor substrate from the impurity diffused region pattern of the reticle pattern and an impurity diffused region which has the same shape as the photoresist pattern and is to be used as a source/drain region is formed.

The phenomenon that only inexact transfer is made depending upon the shape of a reticle pattern appears especially on the corner of the reticle pattern. As measures for this problem, conventionally a selif pattern is added to each corner if necessary. In this embodiment, a selif pattern is likewise added to the corners on which the concave portion characterizing the present invention has no effect. If a photoresist is patterned in such a method, a photoresist pattern is formed in which the round shape is corrected and which is reduced in error.

The number of selif patterns to be added is smaller than in a conventional case and hence working load can be reduced compared with that of the conventional case. As a consequence, each processing dimensional accuracy of the width of the gate electrode in the center portion of the gate electrode forming the drive transistor and load transistor which constitute a memory cell in, particularly, the SRAM and of the width of the gate electrode of the transistors formed on each end of the gate electrode can be improved.

The exactness of the dimension of a gate electrode in a load transistor (pMOSFET) is not so much required as in a drive transistor (nMOSFET). Therefore, the concave portion and the selif pattern are provided only on the side of the drive transistor, making it possible to reduce the working load of layout.

Other than the above embodiments, many variations and modifications are possible. For example, in the second embodiment mentioned above, a conversion difference on the reticle from a design value in the dimension of the width of the gate electrode of the transfer transistor forming the word line can be designed to be smaller than that in an actual case. A gate electrode pattern including a drive transistor and load transistor which constitute an SRAM memory cell is subjected to various treatments such as addition of a concave portion or selif patterns and hence a reticle pattern is produced in a dimension slightly larger than an actual design value. Hence the dimension of the gate electrode of the transfer transistor becomes larger than an actual value. Therefore, the aforementioned treatment is performed. This treatment produces the effect of improving the shortening of a gate electrode forming the drive transistor and load transistor.

The present invention is not limited to the aforementioned SRAMs. The present invention is, of course, effective to improve the processing dimensional accuracy and to reduce an element area also in usual plural MOSFETs which are separated by element isolated regions and formed with regard to a gate electrode pattern. The processing dimensional accuracy of the width of a gate electrode of each MOSFET formed on the same gate electrode is improved and the area occupied by the MOSFETs is reduced, bringing about an effect on high integration.

The present invention can improve the processing dimensional accuracy of the width of a gate electrode of a gate electrode pattern of a MOS transistor wherein both ends of the gate electrode pattern is overlapped on impurity diffused regions constituting the MOS transistor and a contact region is formed in the center of the gate electrode pattern, thereby improving the shortening of the gate electrode. Also, each processing dimensional accuracy of the width of a gate electrode in the center portion formed with a contact of the gate electrode forming a drive transistor and load transistor which constitute an SRAM memory cell and of the width of the gate electrode of the transistors formed on each end of the gate electrode can be improved, thereby improving the shortening of the gate electrode. Moreover, in a highly integrated structure in which drains of a drive transistor and load transistor are electrically connected directly to each other via a local interconnect formed on a semiconductor substrate, even if a contact is formed in the local interconnect, the local interconnect is formed closer to the gate electrode pattern to proceed with high integration since the aforementioned concave portion is formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

forming a gate electrode on a semiconductor substrate by performing a lithography process using a reticle, the reticle having a substantially linear gate electrode pattern having paired first and second long sides and a pair of short sides and being set on two transistor regions and sandwiched region between the two transistor regions of the semiconductor substrate, a convex portion in which at least a part of the sandwiched region is arranged being included in the first long side, a concave portion facing at least the entire length of the convex portion being included in the second long side and being substantially in the sandwiched region, a length of the concave portion parallel to the second long side being longer than a length of the convex portion parallel to the first long side, a width of the concave portion parallel to the short side being smaller than a diameter of a contact portion formed in the sandwiched region and on the gate electrode pattern.

2. A semiconductor or device according to claim 1, wherein the gate electrode pattern corresponds to a gate electrode of a driver transistor of a SRAM memory cell.

3. A semiconductor device according to claim 1, wherein the gate electrode pattern corresponds to a gate electrode of a load transistor of a SRAM memory cell.

4. A method of manufacturing a semiconductor device comprising:

forming a gate electrode on a semiconductor substrate by performing a lithography process using a reticle, the reticle having an elongative gate electrode pattern and being set on two impurity diffused regions and sandwiched region provided between the two impurity diffused regions of the semiconductor substrate, one side of the gate electrode pattern having a convex portion which is included in the sandwiched region, an opposite side of the gate electrode pattern having a concave portion which is included substantially in the sandwiched region, a length of the concave portion being longer than a length of the convex portion, a width of the concave portion being smaller than a diameter of a contact portion formed in the sandwiched region and on the gate electrode.

5. A method according to claim 4, wherein the gate electrode pattern corresponds to a gate electrode of a drive transistor of a SRAM memory cell.

6. A method according to claim 4, wherein the gate electrode pattern corresponds to a gate electrode of a load transistor of a SRAM memory cell.

7. A method according to claim 4, wherein the concave portion positionally corresponds to at least a part of the convex portion.

8. A method according to claim 4, wherein the concave portion positionally corresponds to an overall of the convex portion.

9. A method according to claim 4, wherein the concave portion extends onto gate portions of the impurity diffused regions and positionally corresponds to an overall of the convex portion.

* * * * *